United States Patent
Saito

(10) Patent No.: US 7,286,943 B2
(45) Date of Patent: Oct. 23, 2007

(54) IN-VEHICLE ELECTRONIC DEVICE, THERMAL FLOWMETER AND ELECTRONIC CIRCUIT BOARD

(75) Inventor: Teruhisa Saito, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 21 days.

(21) Appl. No.: 10/822,714

(22) Filed: Apr. 13, 2004

(65) Prior Publication Data

US 2004/0206172 A1 Oct. 21, 2004

(30) Foreign Application Priority Data

Apr. 16, 2003 (JP) .............................. 2003-110970

(51) Int. Cl.
*G01N 31/00* (2006.01)

(52) U.S. Cl. ...................................... 702/32

(58) Field of Classification Search .................. 702/12, 702/45, 100, 32; 73/204.15, 204.22, 204.26, 73/1.16, 861; 436/73; 700/281
See application file for complete search history.

(56) References Cited

U.S. PATENT DOCUMENTS

| | | | |
|---|---|---|---|
| 4,464,932 A * | 8/1984 | Ewing et al. | 73/204.15 |
| 5,150,189 A | 9/1992 | Shirai et al. | |
| 5,756,893 A * | 5/1998 | Kondo et al. | 73/204.22 |
| 5,824,895 A * | 10/1998 | Itsuji et al. | 73/204.17 |
| 6,134,960 A * | 10/2000 | Yamakawa et al. | 73/204.26 |

2003/0087448 A1 * 5/2003 Abe et al. ...................... 436/73

FOREIGN PATENT DOCUMENTS

| | | |
|---|---|---|
| EP | 0 367 11 A2 | 10/1989 |
| EP | 036711 A2 | 10/1989 |
| EP | 09 266359 | 10/1997 |
| JP | 5-259686 | 10/1993 |
| JP | 05275862 | 10/1993 |
| JP | 09266359 | 10/1997 |

* cited by examiner

*Primary Examiner*—Bryan Bui
*Assistant Examiner*—Aditya S. Bhat
(74) *Attorney, Agent, or Firm*—Mattingly, Stanger, Malur & Brundidge, PC

(57) ABSTRACT

Radio-frequency currents vary phases of the radio-frequency voltages appearing at both positive and negative input terminals of an operational amplifier depending on inductance and resistance of conductors forming an electronic device. If the phases of radio-frequency voltages appearing at both positive and negative input terminals of the operational amplifier are different, an offset voltage of the operational amplifier varies to change the operation point of the electronic device resulting in malfunction thereof. In a circuit board for electronic device including a conductor layer for circuit portion formed on an insulated circuit board, the electromagnetic interference preventing function can be improved by forming a conductor not connected electrically to anywhere, a part of conductor connected, via a connection layer, to the positive input signal of the operational amplifier of a circuit portion allocated on the conductor layer for circuit and formed of a monolithic IC, and a part of conductor connected to the negative input signal of the operational amplifier.

6 Claims, 4 Drawing Sheets

US 7,286,943 B2

IN-VEHICLE ELECTRONIC DEVICE, THERMAL FLOWMETER AND ELECTRONIC CIRCUIT BOARD

FIELD OF THE INVENTION

The present invention relates to a in-vehicle electronic device, a thermal flowmeter and an electronic circuit board, for example, to an electronic circuit board provided with electromagnetic interference preventing function and more specifically to an electronic circuit board which is just suitable for reduction in malfunctions caused by electromagnetic field with a hybrid IC or the like on which an electronic circuit is mounted and to an electronic device utilizing the same electronic circuit board.

BACKGROUND OF THE INVENTION

As described in the patent document 1, electromagnetic noise is shielded using a radio-frequency filter as the technology of electronic circuit board for improving the electromagnetic interference preventing function in the prior art.

[Patent document 1]

Japanese Unexamined Patent Publication No. Hei 05(1993)-259686

In the prior art, it is still required to prevent malfunction of an electronic circuit due to electromagnetic noise of higher frequency and larger output level. In order to overcome this requirement described above, malfunction can be prevented by adding a capacitor and an inductor. However, the electronic circuit board becomes too large to satisfy the requirement for reduction in size. Moreover, addition of capacitor and inductor will cause a problem of rise in cost due to increase in number of components.

SUMMARY OF THE INVENTION

An object of the present invention is to realize a low-price electronic device which assures excellent electromagnetic interference preventing function, although the circuit is small in physical structure.

The above-mentioned object can be attained with the invention described in the claims thereof.

For example, the object described above can be attained with a in-vehicle electronic device comprising a conductor member, an insulation member and an amplifying means for inputting signals from a first signal line and a second signal line and outputting the amplified signals, in which the conductor member is provided to cover at least one of the first signal line and second signal line via the insulation member.

For example, the object described above can also be attained by further providing a supporting means for supporting the first signal line, second signal line and amplifying means and by covering, with the conductor member, any one of the first signal line and second signal line in the opposite side of the signal line supported with the supporting means via the insulation member.

For example, the object described above can also be attained with the structure that the amplifying means is formed as an operational amplifier, the supporting means is formed as a circuit board, the first signal line and second signal line are formed as metal wirings printed on the circuit board, and the insulation member and conductor member are formed as layers.

For example, the object described above can also be attained with the structure that the conductor member covers the other side of the first signal line and second signal line described above via the insulation member.

For example, the object described above can also be attained with a thermal flowmeter which comprises a heat generating resistance body placed within a path through which the air flows and an electronic circuit board provided with an amplifying means for inputting signals from the first signal line and second signal line and outputting the amplified signals and a conductor member for covering at least one of the first signal line and second signal line via an insulation member, wherein the signal from the resistance body is inputted to the first signal line to measure flow rate of the air flowing through the path.

Moreover, operations of the present invention will be described below.

Electromagnetic noise will enter, as a radio-frequency current, an electronic device from any one of the elements of an electric connecting portion to the external side such as the power supply, reference potential and output portions and conductors forming the electronic circuit board.

This radio-frequency current changes phases of radio-frequency voltages appearing at both positive and negative input terminals of the operational amplifier depending on inductance and resistance of conductors forming the electronic device. Since inductance of conductor changes in accordance with various factors such as shape of angled portions and existence of directly grounded (GND) portions or the like, if phases of the radio-frequency voltages appearing at both positive and negative input terminals of the operational amplifier are different from each other, an offset voltage of the operational amplifier changes to change the operation point of an electronic device which will result in malfunction thereof.

Here, in the circuit board for electronic circuit including the conductor layer for circuit formed on the insulated board of the present invention, a conductor which is not connected electrically to anywhere is formed, via a connecting layer, in the vicinity of a part of conductor connected to the positive input signal of the operational amplifier of the circuit portion allocated on the conductor layer for circuit and formed of a monolithic IC and a part of conductor connected to the negative input signal of the operational amplifier. Accordingly, the electromagnetic interference preventing function can be improved because inductance of the conductor connected to both positive and negative input signals of the operational amplifier utilizing an eddy current can be reduced and phases of radio-frequency voltages appearing at both positive and negative input terminals of the operational amplifier are never deviated. Moreover, since the conductor not connected electrically to anywhere, the conductor connected to the positive input signal of the operational amplifier of the circuit portion allocated on the conductor layer for circuit and formed of the monolithic IC, and the conductor connected to the negative input signal of the operational amplifier are terminated for the AC element through the capacitance-coupling in the circuit board for electronic device including the conductor layer for circuit, the electromagnetic interference preventing function can also be improved.

DETAILED DESCRIPTION OF THE INVENTION

Figure 3:
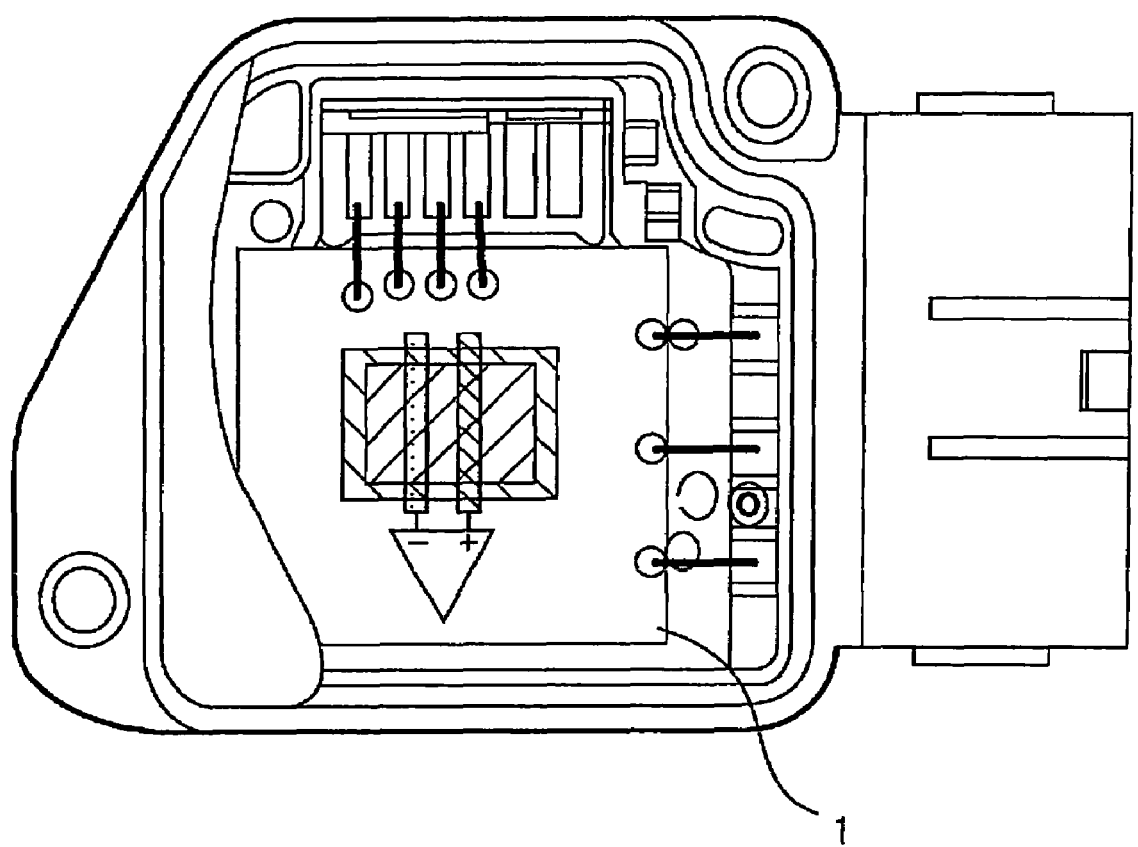
FIG. 3 is a partly cutout external view of the essential portion of a thermal air flowmeter.
Figure 4:
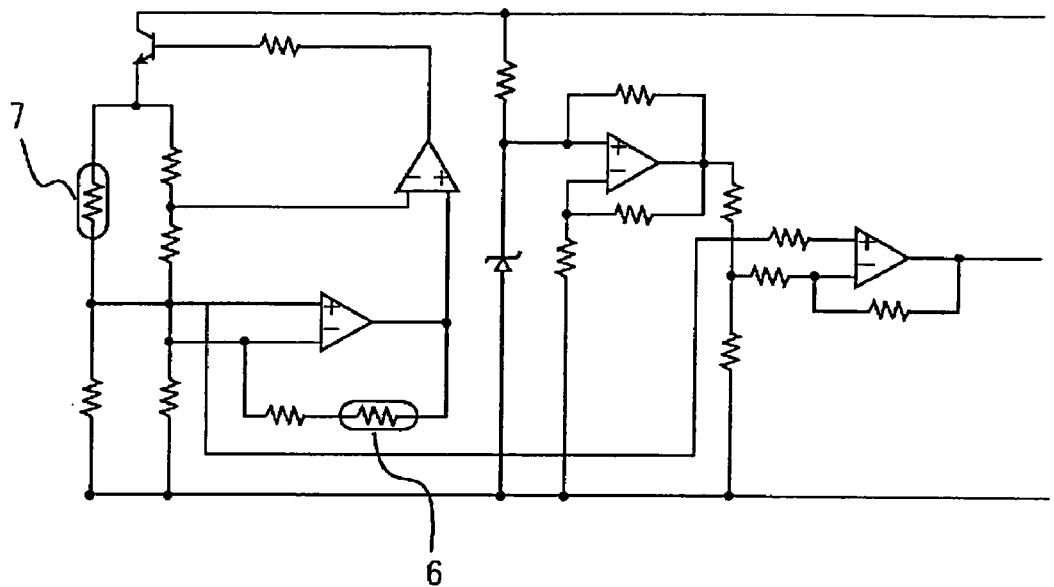
FIG. 4 is a block diagram of the electronic circuit board.

The preferred embodiment of the present invention will be described below with reference to the accompanying drawings. FIG. 3 is a partly cutout external view of the essential portion of the thermal air flowmeter as the preferred embodiment of the present invention. The electronic circuit board of this embodiment has been manufactured using a hybrid IC. FIG. 4 is a block diagram of the electronic circuit board. The thermal air flowmeter is formed of a temperature sensitive resistance body 6 which is placed in the air flow within an intake pipe of an engine, a heat generating resistance body 7, and a hybrid IC including an electronic circuit.

Figure 1:
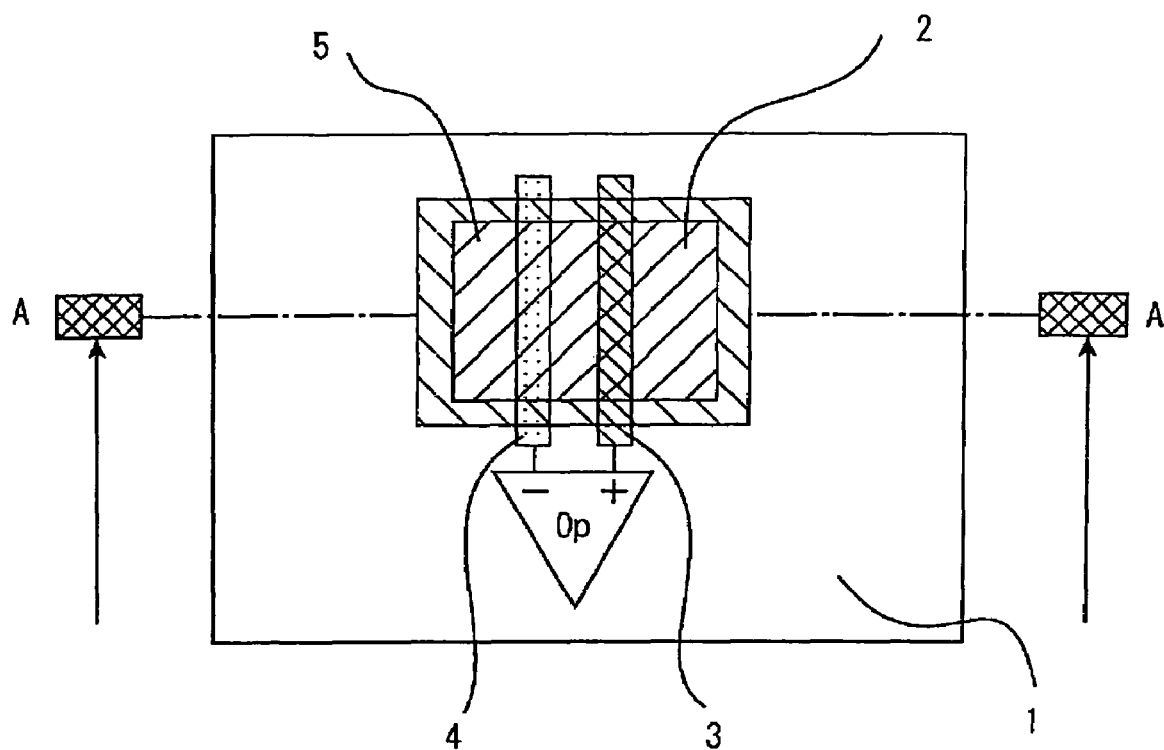
FIG. 1 is a plan view of an electronic circuit board of the embodiment of the present invention.
Figure 2:
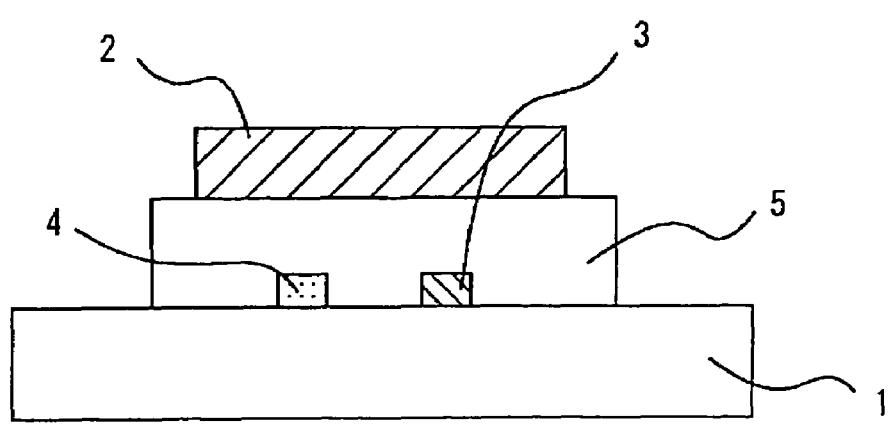
FIG. 2 is a cross-sectional view along the line A-A of FIG. 1.

FIG. 1 is a plan view of the hybrid IC, while FIG. 2 is a cross-sectional view along the line A-A of FIG. 1.

In the electronic circuit board including a conductor layer for circuit formed on an insulated circuit board, the electromagnetic interference preventing function thereof can be improved by forming, as the characteristic thereof, the conductor 2 not connected electrically to anywhere in the vicinity of a part of the conductor 3 connected to the positive input signal of the operational amplifier of the circuit portion allocated on the conductor layer for circuit and formed of the monolithic IC and a part of the conductor 4 connected to the negative input signal of the operational amplifier.

The input/output wires are called the wire harnesses which are extended for the wiring within an automobile. Therefore, various electromagnetic noises are superimposed on electrical signals. Moreover, some electromagnetic noises are propagated through the space and superimposed in direct to the conductors which are forming the circuits.

In this embodiment, the electromagnetic interference preventing function can be improved because the phases of the radio-frequency voltages appearing at the input terminal of the operational amplifier are matched by reducing inductance of the input signal conductor by utilizing an eddy current flowing through the conductor 2 which is formed via both input signal conductors 3, 4 of the operational amplifier and the insulation layer 5 and is not connected electrically to anywhere.

Moreover, since both input signal conductors 3, 4 of the operational amplifier of the circuit portion allocated on the conductor layer for circuit and formed of the monolithic IC are capacitance-coupled with each other via the conductor 2 which is not connected electrically to anywhere to terminate an AC element, the electromagnetic interference preventing function can be improved.

Even when a metal plate is substituted for the conductor 2 which is not connected electrically to anywhere and a shield wire is substituted for both input signal conductors 3, 4 of the operational amplifier, the similar effect can also be expected.

Figure 5:
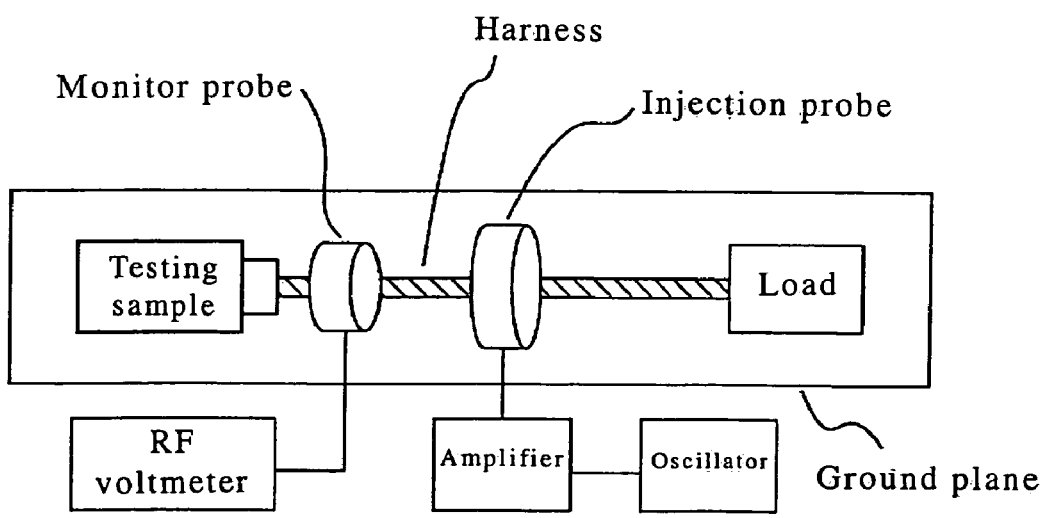
FIG. 5 is a schematic diagram illustrating a bulk current injection testing method for the frequency of 10 to 100 MHz.
Figure 6:
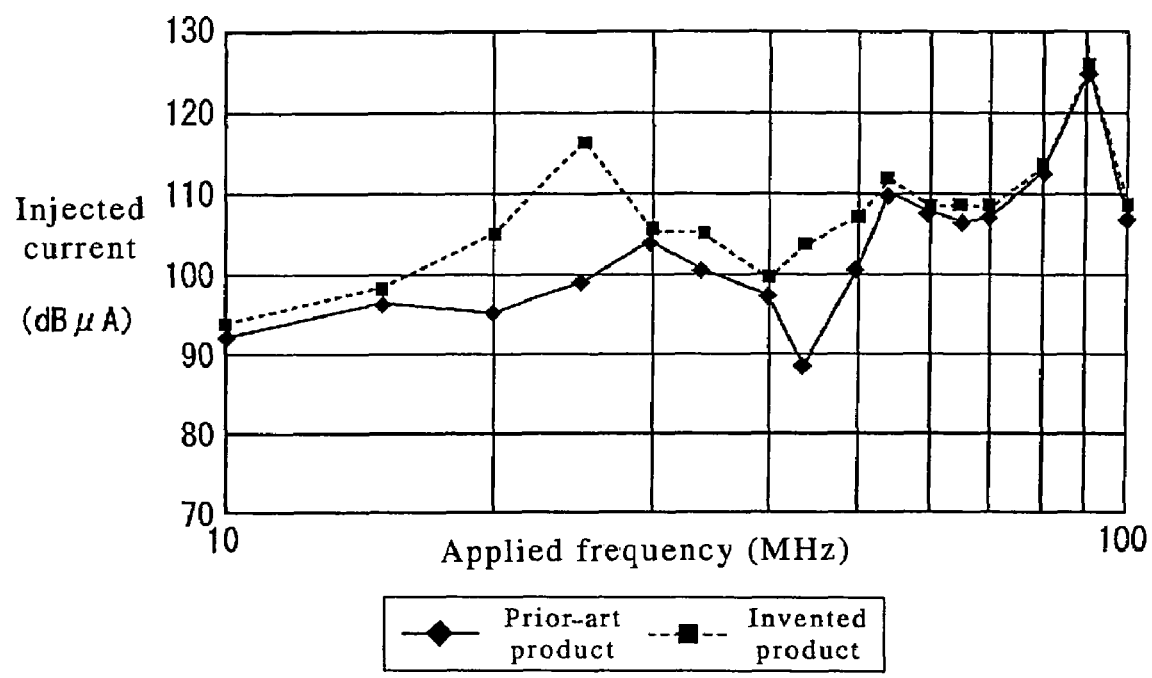
FIG. 6 illustrates the result of bulk current injection test of the device of the present invention.

The EMC evaluation has been performed for both products of the present invention and prior art. The testing method is the bulk current injection method which is schematically illustrated in FIG. 5. In this method, the electromagnetic noise which is generated with an oscillator and is amplified with an amplifier is applied, within the measuring frequency of 1 to 400 MHz, the testing objects from the harness using an ignition probe. FIG. 6 illustrates the result of test in the frequency range of 10 to 100 MHz in which particular effect of the electromagnetic interference preventing function testing result of the thermal air flowmeter to which the present invention is applied can be confirmed. An injected current value means a radio-frequency injected current value which brings about a change in output of 10%.

The embodiment of the present invention can provide the effect that the electromagnetic interference preventing function of the thermal air flowmeter can be improved without increase in the chip components even when the electronic circuit board is increased in size.

What is claimed is:

1. An electronic circuit board comprising:
   a substrate;
   a circuit conductor layer on a substrate having first and second conductors;
   an operational amplifier comprising a monolithic IC and connected to the circuit conductor layer via the first and second conductors, the first conductor being connected to a positive input of the operational amplifier and the second conductor being connected to a negative input thereof;
   a third conductor; and
   an insulating layer,
   wherein the circuit conductor layer, the third conductor, and the insulating layer are all disposed on the substrate with the insulating layer disposed between the circuit conductor layer and the third conductor, wherein the first and second conductors are at least partially located below or above the third conductor layer, and wherein the third conductor is not electrically connected with any part.

2. The electronic circuit board according to claim 1, wherein the third conductor is a metal plate mounted on the insulating layer.

3. The electronic circuit board according to claim 1, wherein
   the first conductor of the circuit conductor layer that is connected to the positive input of the operational amplifier and the second conductor of the circuit conductor layer that is connected to the negative input of the operational amplifier are each comprised of a central conductor in a separate shield line, wherein the third conductor is comprised of a covering conductor of the respective parts of each of the shield lines,
   and wherein the covering conductor of the individual shield lines is not connected to any of the other conductors.

4. The electronic circuit board according to claim 1, wherein the electronic circuit board is part of a thermal flowmeter.

5. The electronic circuit board according to claim 1, wherein the electronic circuit board is part of a thermal flowmeter, and wherein the third conductor and the first and second conductors are capacitance coupled with each other via the third conductor to terminate the alternating current element.

6. The electronic circuit board according to claim 1, wherein the electronic circuit board is part of a thermal flowmeter, and wherein the first conductor of the circuit conductor layer that is connected to the positive input of the operational amplifier and the second conductor of the circuit conductor layer that is connected to the negative input of the operational amplifier are each comprised of a central conductor of a separate shield line, and wherein the first and second conductors are capacitance coupled with each other via the third conductor to terminate the alternating current element.

* * * * *